Figure 1:
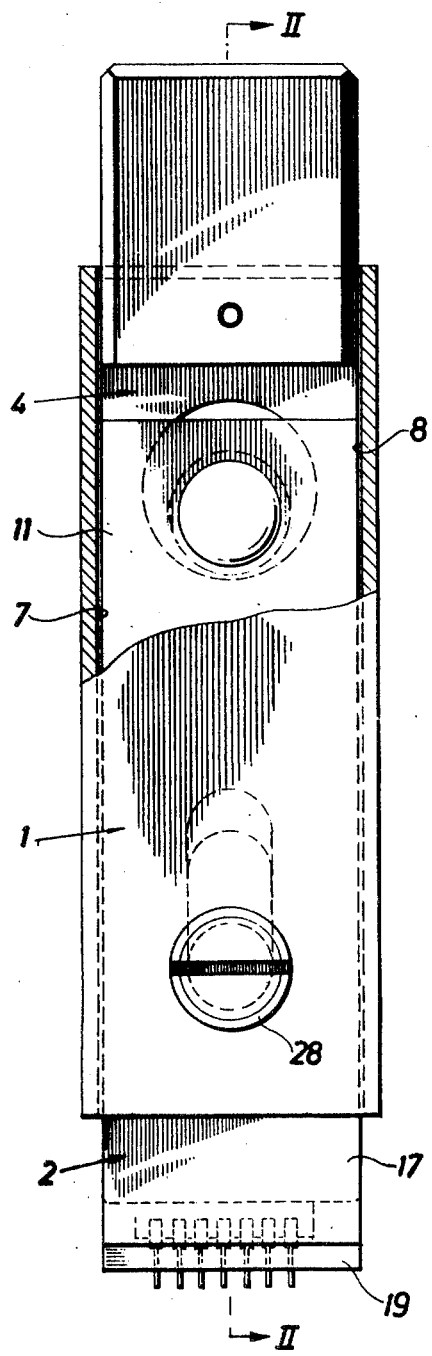

United States Patent [19]

Wolkert

[11] 4,179,803
[45] Dec. 25, 1979

[54] DEVICE FOR HANDLING ELECTRICAL COMPONENTS

[76] Inventor: Per O. M. Wolkert, Kungsvägen 1, Trångsund, Stockholm, Sweden

[21] Appl. No.: 845,133

[22] Filed: Oct. 25, 1977

[30] Foreign Application Priority Data

Oct. 21, 1976 [SE] Sweden .................... 7611721

[51] Int. Cl.² .................... H05K 3/30; H05K 13/04
[52] U.S. Cl. .................... 29/741; 29/758; 29/764
[58] Field of Search .................. 29/741, 764, 758, 740, 29/739

[56] References Cited

U.S. PATENT DOCUMENTS

| 3,535,763 | 10/1970 | Helton | 29/741 |
| 3,699,629 | 10/1972 | Hood, Jr. et al. | 29/764 |
| 3,896,533 | 7/1975 | Ullman et al. | 29/741 X |

Primary Examiner—Carl E. Hall
Attorney, Agent, or Firm—Brady, O'Boyle & Gates

[57] ABSTRACT

A device for inserting a Dual-in-Line package in a printed circuit board or socket. Two elongate resilient gripping elements are movably mounted within a rectangular tubular body. The opposed gripping end portions of the gripping elements extend out of one end of the body and the opposite end portions of the elements are connected to each other and coupled to a manual actuator extending out of the other end of the body. The gripping elements are springy and include portions which diverge and are biassed against opposed inner guiding surfaces at said one end of the body. When the gripping elements are expelled out of the body by depressing the manual actuator, the gripping ends are separated due to spring biassed spreading of the gripping end portions, enabling the gripping end portions to be applied over the package. The gripping elements are retracted in the body to bring the gripping ends towards each other for gripping the terminal pins of the package by moving the body while the gripping elements are retained by co-action with an abutment.

21 Claims, 7 Drawing Figures

U.S. Patent  Dec. 25, 1979  4,179,803

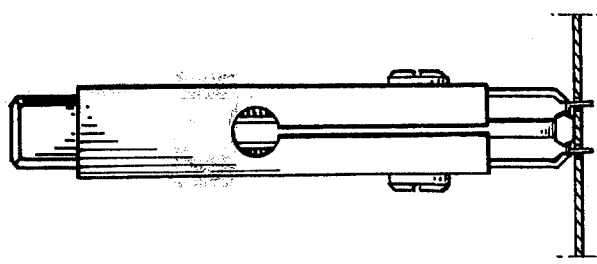
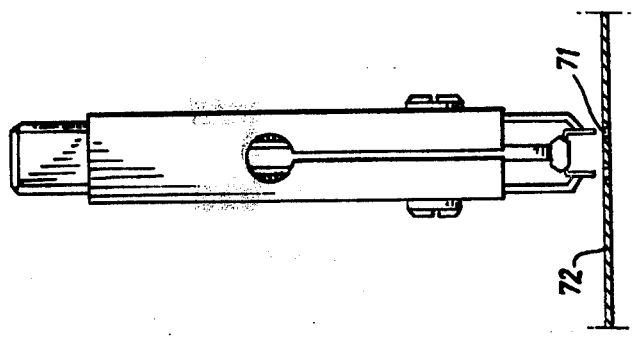
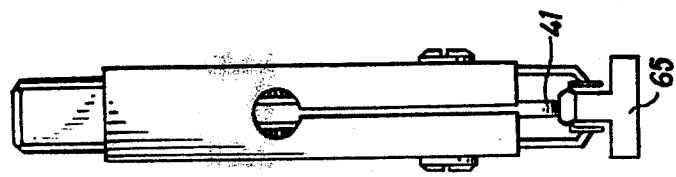
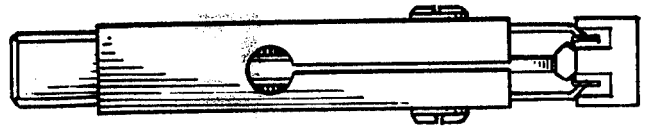
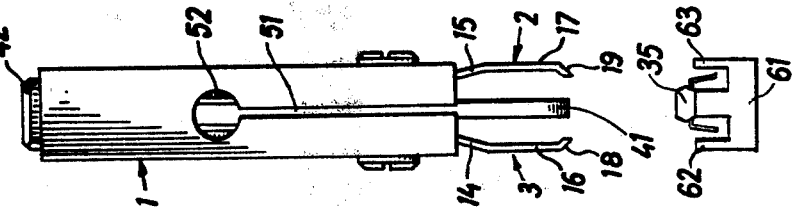

DEVICE FOR HANDLING ELECTRICAL COMPONENTS

The present invention relates to a device for handling an electrical component provided with a plurality of terminal pins projecting in one and the same direction, said device comprising a handle or body portion and gripping means associated therewith, operable for releasably gripping the electrical component. The device is specially intended for handling components having terminal pins arranged in at least two substantially parallel rows and particularly for mounting or inserting such a component on a printed circuit board.

Components with two substantially parallel rows of terminal pins are often to be found in the form of a so-called D-package (Dual-in-line package), also called DIP or DIL. Such a package can, for example, contain an integrated circuit, a resistance net or relay functions. Usually, the DIP comprises an elongate body from the long sides of which the terminal pins initially project outwardly in opposite directions, thereafter being bent substantially straight downwards so that the two substantially parallel rows of pins are formed. However, on a more recently available new type of component, the so-called "side-brazed" type, the terminal pins are brazed directly to the sides of an elongate body.

As mentioned, the terminal pins are not arranged in exactly parallel rows in the above cases. Instead, the pins are arranged so that they diverge somewhat outwardly from the component body itself, so that the distance between the opposing ends of the pins exceeds in a predetermined way the distance between the rows of holes in which the pins are intended to be inserted. The reason for this is that the component, after having been mounted in associated holes in a printed circuit board or socket, is desired to remain in place as a result of the spring action in the terminal pins, in the printed circuit board case until soldering has been performed.

Considering the formation of the terminal pins to the right hole spacing thus necessary when a DIP is inserted, it will be appreciated that manual insertion is very difficult and that there is great need of some device for simple mechanical insertion of packages of the kind mentioned.

A type of device for manual mechanical insertion of DIPs, known for example from the U.S. patent specification No. 3,699,629, comprises an elongate handle portion having an elongate gap at its bottom end, with two parallel guiding surfaces for co-action with and the formation of the terminal pins on a DIP introduced into the gap. The device also comprises an operable ejection mechanism arranged to act on the upper face of the package to eject it from the gap after its terminal pins have been inserted in corresponding holes in a socket, for example.

This type of insertion device has a number of serious drawbacks. It is thus necessary to force each package to be inserted into the gap of the device provided for accommodating packages (with great risk of scratching damage to the terminal pins), which requires narrow tolerances with regard to the basic formation and material thickness of the terminal pins, if satisfactory function is to be achieved. The clamping force obtained on the upper parts of the terminal pins has been found to result in extensive malfunction due to crack formation, leaks and other mechanical defects. Neither does the device give any compensation options at all for different package sizes and is unusable for packages of the side-brazed type, or those where the configuration of the terminal pins or their connection to the body of the package itself deviates in some other way from what is most usual.

The object of the present invention is therefore to provide a device of the kind mentioned in the introduction, without the above-mentioned disadvantages and having a series of advantages enabling very quick and simple as well as to different tasks easily adaptable handling, especially one-handed insertion, of electrical components of the kind discussed.

This object has been attained by providing the device according to the invention with the characteristic features set forth in the appended claims.

Figure 2:
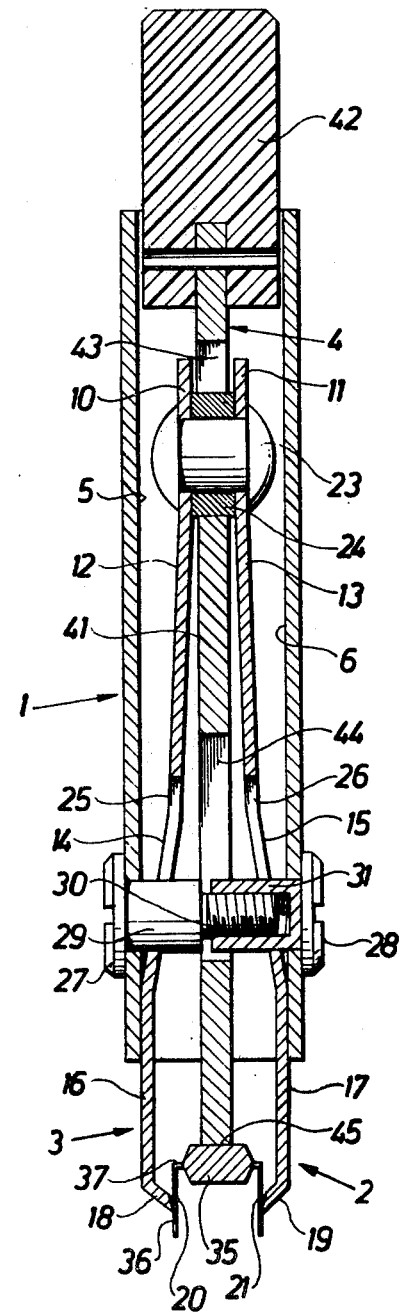

The invention will now be described in more detail by means of an embodiment example, while referring to the appended drawing, in which FIG. 1 shows a side view of a device according to the present invention, with certain parts removed, said device retaining a gripped DIP;

FIG. 2 is a central longitudinal section through the device shown in FIG. 1, the section being taken along a line II—II in FIG. 1; and FIGS. 3-7 are schematic views illustrating the working mode of the device according to FIGS. 1 and 2, in conjunction with plucking or loading a DIP from a storage strip of stick and inserting the DIP in corresponding mounting holes in a printed circuit board.

The device according to the invention as shown in FIGS. 1 and 2 comprises three main parts, i.e. a handle or body part 1, a pair of co-acting gripping elements 2 and 3 and an actuating or operating means 4. The gripping elements 2, 3 and the operating means 4 are coupled to each other and are displaceably arranged or suspended inside the handle or body part 1, as will be described in more detail later.

The body part or casing 1 consists of a straight quadrilateral tube, open at both ends, and with a rectangular inside cross-section. The quadrilateral tube or sleeve thus has two pairs of flat opposing parallel surfaces 5,6 and 7,8, respectively, said surfaces at least partly constituting guiding surfaces for the gripping elements 2,3 and the operating means 4 in conjunction with relative displacement between the gripping elements and the operating means and the quadrilateral tube.

The gripping elements 2 and 3 are made identical, although they are arranged in symmetrical, mirrored opposition in the quadrilateral tube. The gripping elements are made from yieldingly resilient steel band material having a width somewhat less than the greatest inside width of the quadrilateral tube, i.e. the width between the opposing parallel flat surfaces 7,8. Each gripping element comprises an attachment end portion 10 and 11, respectively, merging into a first outwardly angled portion 12 and 13, respectively, merging into a second more heavily outwardly angled portion 14 and 15, respectively, merging into a portion 16 and 17, respectively, which in the shown gripping position is substantially parallel to and at least partially abuts against the bottom portion of the interior surface 5 and 6, respectively, of the quadrilateral tube and which extends a not inconsiderable distance out of the quadrilateral tube in the example shown, as well as a terminating gripping end portion 18 and 19, respectively, angled inwardly and having a gripping end 20 and 21, respectively.

The attachment end portions 10, 11 of the gripping elements 2, 3 are fixedly connected to each other by means of a rivet 23, there being a bushing 24 arranged around the rivet between the attachment end portions 10, 11, to keep the attachment end portions at a predetermined distance from each other for displaceable coupling to the operating means 4, as will be described im more detail later. The joint between and the configuration of the band-shaped gripping elements 2,3 is such that the gripping elements are resiliently biassed to diverge from each other to a greater extent than what is permitted by the guiding surfaces 5,6 in the quadrilateral tube 1. In the position shown, the portions 16,17 of the gripping elements are thus spring biassed against the guiding surfaces 5 and 6, respectively. The spring bias or action and the frictional conditions are so adjusted that the gripping elements are kept in position relative to the quadrilateral tube while a relative movement between the gripping elements and the quadrilateral tube can be easily achieved by one-handed operation.

Each of the gripping elements 2 and 3 is provided with an elongate hole 25 and 26, respectively, in the angled portions 12, 14 and 13,15, respectively, for co-action with means 27,28 keeping the device together and serving as a stop, said means extending from one side of the quadrilateral tube to the other through the holes 25 and 26. The means 27, 28 partly comprise a screw 27, inserted through a corresponding hole in one side wall of the quadrilateral tube and having a circular-cylindrical stop portion 29 co-acting with and having substantially the same diameter as the width of the elongate hole 25, and a threaded portion 30; and partly comprise a sleeve nut 28, with a head, the nut being inserted in a corresponding hole in the other side wall of the quadrilateral tube and having a circular-cylindrical sleeve portion 31 internally threaded to receive the threaded screw portion 30, and having an external diameter substantially the same as the width of the elongate hole 26 with which it co-acts.

It will be appreciated that the above-mentioned arrangement enables displacement of the gripping elements 2,3 relative to the quadrilateral tube 1 in the longitudinal direction of the latter, between two end positions, of which one is the position shown in FIGS. 1 and 2. In this end position, constituting the gripping position, the gripping elements 2,3 are withdrawn or retracted a maximum into the quadrilateral tube 1, the stop portion 29 and the sleeve portion 31 abutting against the bottom, rounded defining surface of the respective holes 25 and 26. In the second end position, constituting the plucking or picking-up position (shown in FIG. 3) the portions 16, 17 of the gripping elements 2,3 are completely expelled out of the quadrilateral tube 1, the stop portion 29 and the sleeve portion 31 abutting against the upper, rounded, defining surface of the respective holes 25 and 26. As will be appreciated, in this end position the end portions of the gripping elements will be flared out due to the aforesaid spring action i.e. they have also been displaced in a direction laterally to the longitudinal direction of the quadrilateral tube, to an extent determined by the co-action between the bottom portions of the guiding surfaces 5,6 and the angled portions 14 and 15, respectively, of the gripping elements 2,3. In other words, the outwardly facing surfaces of the portions 14,16 and 15,17, respectively, of the gripping pieces 2,3, constitute guiding or cam surfaces, the co-action of which with the guiding surfaces 5,6 in the quadrilateral tube determines the mutual position of the gripping ends 20,21 of the gripping elements.

As is shown in FIGS. 1 and 2, the gripping ends 20,21 of the gripping elements 2,3 retain an integrated circuit in the shape of a DIP 35 by co-action with the terminal pins 36 of the package, close to their ends. The gripping ends 20,21 have flat gripping surfaces, the mutual spacing of which in the gripping position accurately corresponds to the desired distance between the ends of the terminal pins 36 for adaptation to the hole spacing in the board or the socket in which the integrated circuit is to be inserted. It has been found advantageous not to allow the gripping surfaces to be completely parallel in the gripping position, but to allow the gripping surfaces to converge or incline somewhat inwardly towards each other, as seen in a downward direction. It has been found suitable for the gripping surfaces to form an angle with the plane of symmetry or general direction of the device which is between about 5° and about 10°. Contact between the gripping surfaces and the terminal pins as far down on the latter as possible is hereby ensured, which is of importance for avoiding bending the pins inwards. Taking into consideration that an accurately set distance between the gripping ends 20,21 is thus of great importance, it has been found suitable to make the device according to the invention so that this distance is adjustable. Thus adjustability has been achieved by providing each narrow side wall of the quadrilateral tube 1 with a centrally disposed slot 51 (see FIG. 3) extending from the bottom edge of the tube to about half-way up where the slot opens out into a circular hole 52, and by having the stop means 27,28 arranged for screwing together an adjustable amount. The distance between the bottom portions of the guiding surfaces 5 and 6 can be hereby adjusted and thus also the distance between the gripping elements guided thereby.

The gripping end portions 18,19 of the gripping elements 2,3, especially their outsides, are formed in a suitable way for constituting abutting means for co-action with a suitable abutment, e.g. a storage strip, when gripping a package 35. This abutting function will be described in more detail later, in connection with FIGS. 3–7.

It should be appreciated that the portions of the gripping elements permanently outside the handle or body part, i.e. the quadrilateral tube in FIGS. 1 and 2, may have an optional configuration for suiting the stop function mentioned above, as well as the type of component gripped, e.g. with regard to the width, length and placing of the terminal pins of the component, or whether it has portions projecting sideways which must be encompassed but not touched by the gripping elements, etc. An example of this is when the component is substantially wider than the handle or body portion of the device, which requires that the gripping elements outside the handle or body portion must also comprise outwardly directed portions. Other examples of this are that the gripping ends of the gripping elements are substantially wider than remaining portions thereof, or are provided with grooves or notches for the terminal pins.

The operating means 4, mentioned hereinbefore, comprises a rigid straight band-like plunger 41 and an operating button 42 attached thereto. The plunger 41 has substantially the same width as the gripping elements 2,3 and extends from the top portion of the quadrilateral tube 1 through the whole tube and out from it a specific distance between the gripping elements 2,3. The plunger is disposed in a longitudinal plane of symmetry between the interior surfaces 5,6 of the quadrilateral tube. Two holes 43,44 are taken up in the plunger, the bushed rivet 23 and the stop means 27,28 passing through said holes. The hole 43 enables the gripping elements 2,3 and the operating means 4 to be restrictedly displaceable relative to each other in the longitudinal direction of the device. The hole 44, the width of which substantially corresponds to the width or diameter of the stop means 27,28, is elongate and has such an extension that required movements of the gripping elements 2,3 relative the quadrilateral tube 1 in its longitudinal direction are not hindered. The hole 44 can also give a guiding effect during relative displacements in the longitudinal direction of the device and can furthermore be utilized to provide a stop function in certain cases, as will be disclosed later.

The operating button 42, which extends upwardly out of the quadrilateral tube is rigidly attached to the upper end of the plunger 41, and has a rectangular cross section, substantially corresponding to the inside cross-section of the quadrilateral tube 1, giving a guiding action in the longitudinal direction. The height of the operating button 42 is sufficient so that with its help it is possible to displace the gripping elements 2,3 out of the tube from the shown gripping position to the previously mentioned plucking or picking-up position, taking into account the restricted displaceability between the gripping elements 2,3 and the plunger 41, due to the hole 43.

The purpose of the restricted longitudinal displaceability between the gripping elements 2,3 and the plunger 41 is as follows. In the position shown in FIGS. 1 and 2, constituting one end position for the restricted relative displacement and meaning that the bottom portion of the bushing 24 is in engagement with the bottom defining surface of the hole 43, the bottom end of the plunger 45 is situated at a maximum distance from the gripping ends 20,21 of the gripping elements 2,3. This distance is advantageously selected so that if a gripped package 35 co-acts with the bottom end 45 of the plunger 41, the gripping ends 20,21 then co-act with the terminal pins 36 of the package at a desired predetermined distance from the ends of the pins. The package 35 and the end 45 of the plunger 41 can hereby constitute abutment and abutting portion respectively (and give a guiding or alignment effect at the same time) in conjunction with gripping the package, as will be apparent from the detailed description of the operating mode of the device, following later.

The second end position for the restricted relative displacement between the gripping elements 2,3 and the plunger 41 means that the upper portion of the bushing 24 is in engagement with the upper defining surface of the hole 43, the bottom end 45 of the plunger 41 being situated at a minimum distance from the gripping ends 20,21 of the gripping elements 2,3. This end position is achieved in conjunction with a gripped package 35 being mounted in holes corresponding to its terminal pins, for example, in a printed circuit board. After the package terminal pins 36 have been placed in the mounting holes (the package still being gripped by the device according to the invention in the mode shown in FIGS. 1 and 2) with the gripping ends close to the surface of the printed circuit board, the press button 42 is namely depressed so that said second end position is attained, the package then guidingly being displaced relative to the gripping elements 2,3 in a direction out from the gripping elements and the terminal pins further into the mounting holes a desired pre-determined distance.

Continued depression of the press button is subsequently not generally possible, since the package is now in the right position on an undisplaceable substructure. The continued inserting or mounting procedure involves instead relative movement between the operating means 4 (and the gripping elements 2,3 locked thereto) and the quadrilateral tube 1, by the tube being caused to move upwards away from the package, while the operating button is kept stationary, i.e. the bottom end 45 of the plunger 41 is kept pressed against the package. After a certain amount of such upward displacement of the quadrilateral tube, the gripping elements 2,3 release their grip on the package terminal pins, viz. when the portions 16,17 of the gripping elements 2,3 have come to lie entirely outside the quadrilateral tube due to movement relative to the tube, and the gripping elements begin to diverge, guided by the co-action between the cam or guiding portions 14,15 of the gripping elements and the inside guiding surfaces 5,6 of the quadrilateral tube. It is to be emphasized in this connection that the friction conditions must naturally be such that there really is relative movement between the quadrilateral tube and the gripping elements, and not relative movement between the gripping ends of the gripping elements and the terminal pins of the package, in case the second end position should not have been reached when the package is in the right position and can no longer be displaced.

With regard to the relative displacements in longitudinal direction, it must be pointed out that the device shown in FIGS. 1 and 2 includes a plurality of control or guide functions for this purpose, such as adaptation of the widths of the holes in the gripping elements and the plunger to the width of the means extending through the holes, adaptation of the push button cross-section to the cross-section of the quadrilateral tube, adaptation of the plunger width to the inside width of the quadrilateral tube and adaptation of the width of the gripping elements to the inside width of the quadrilateral tube. It should, however, be appreciated that the device does not need to include all these control or guide functions but only a suitable selection thereof.

It should be appreciated that the first end position for the restricted relative displacement between the gripping elements 2,3 and the plunger 41 could also be determined by engagement between the lower defining surface of the hole 44 in the plunger and the bottom portion of the stop means 27,28. In such a case, this first end position could be simply varied, e.g. by a thin washer, bushing or the like being provided at the centre of the stop means 27,28, kept in position between the stop portion 29 and a shortened sleeve portion 31, for example.

It should be further appreciated that the bottom end 45 of the plunger 41, intended for co-action with a package, could be made in a number of different ways. With the narrow configuration shown in FIG. 2, it will indeed be possible to co-act with the upper face of a package or a circuit of the so-called "side-brazed" type, i.e. the end 45 can pass between the terminal pin joints located along the sides of the package and extending onto its upper face, but the alignment effect obtained can be unsatisfactory in certain cases. Varying thickness of the package body itself can also cause problems in connection with direct co-action between the underside of the plunger and the upper side of the package. The bottom end of the plunger could therefore be formed to advantage with means for co-action with the upper sides of the terminal pin portions 37 projecting substantially horizontally from the package 35 itself, since the distance of these from the ends of the terminal pins 36 is in general very well defined.

The operating mode for the device shown in FIGS. 1 and 2 will now be described in more detail while referring to FIGS. 3–7.

In FIG. 3 the device according to the invention is shown in the plucking or picking-up position, i.e. with the operating button 42 depressed and the gripping elements 2,3 expelled and flared. The device is shown above a schematically indicated storage strip 61, carrying a DIP 35 which is to be gripped for insertion in a printed circuit board. The strip 61 has two parallel side elements 62 and 63 which can constitute abutments and against which the gripping end portions of the gripping elements 2,3 can co-act.

In order to grip the package 35 the device according to the invention (which is holdable in one hand by having the fingers grip around the quadrilateral tube 1) is moved down over the package so that the flared gripping elements 2,3 enclose the package and so that the outsides of the gripping end portions 18,19 come into contact with the inner edges of the side elements 62 and 63 of the storage strip 61. The gripping elements are hereby prevented from moving further downward to any significant extent. The quadrilateral tube 1 is now moved downwards towards the package 35, a relative movement taking place between the gripping elements and the quadrilateral tube in a direction towards the gripping position shown in FIGS. 1 and 2. During the first part of the relative movement, the portions of the angled gripping element portions 14 and 15, which in the plucking position are outside the quadrilateral tube pass into the tube, the end portions of the gripping elements being urged in towards each other as a result of cam or guiding action between the cam or guiding surfaces of the portions 14,15 and the bottom portions of the inner guiding surfaces 5,6 of the quadrilateral tube, and into engagement with the terminal pins of the package at a desired level, i.e. near the ends of the pins, so that the spring bias will remain in the pins after insertion. At the moment when the portions 14 and 15 have completely passed into the quatrilateral tube and the now parallel portions 16,17 begin to co-act with the guiding surfaces 5,6, full gripping effect has been obtained and the gripping ends have formed the terminal pins to the desired mutual distance between the two rows of terminal pins. This condition is noticed immediately by the one holding the device according to the invention, since the force required to urge the quatrilateral casing downwards is drastically reduced. In other words, there is obtained a clear indication that the gripping sequence has been completed in principle. It is, however, possible to complete the downward thrust of the quatrilated casing, either until the completely retracted position shown in FIGS. 1 and 2 is obtained, or until a desired intermediate position is obtained. This condition is shown in FIG. 4.

It will be understood that the initial displacement of the quatrilateral tube, providing the lateral relative displacement of the gripping elements forming the outline of the terminal pins, can be made suitably long to obtain good "force gear change".

With regard to the plunger 41, in the described case it can initially rest on top of the package 35, but in the completed gripping position it suitably co-acts with the upper side of the package for supporting purposes.

In FIG. 5 there is shown an alternative mode of plucking or loading a DIP from a storage strip 65 having another design. The storage strip 65 shown in this figure lacks special abutment for the gripping elements of the device according to the invention. The necessary abutment effect is instead obtained by the bottom end of the plunger 41 co-acting with the top face of the package. Gripping otherwise takes place in principle in the same way as described above.

FIGS. 6 and 7 illustrate how a DIP gripped as described above can be mounted in holes 71 in a printed circuit board, the holes being adapted to the terminal pins of the package. The device according to the invention with the gripped package, the terminal pins of which have thus been brought into parallelity is brought up to the printed circuit board, and the well visible portions of the terminal pins projecting from the gripping elements are aligned with the holes 71 and inserted therein. The ends of the gripping elements can hereby be allowed to rest against the printed circuit board. The operating button 42 is then depressed, the package being ejected and its pins pressed completely down in the holes 71 in accordance with what has been described hereinbefore. FIG. 7 thus shows the condition prevailing immediately before the gripping elements have begun to be separated.

If incorrect insertion has taken place for example, the device according to the invention can be utilised to withdraw the incorrectly inserted package. In this case one operates in principally the same mode as has been described, but the printed circuit board will now constitute the abutment and the gripping ends the co-acting abutting portions.

While the invention has been described in detail by means of a specific embodiment, it is of course not limited thereto but variations and modifications are possible within the scope of the appended claims. For example, the term handle or body portion may include pistol-like arrangements of the type usual in connection with handling electrical components. Although the device according to the invention is specially suited for one-handed operation, it can, for example, also be advantageously applied to an arm or the like, in a machine for automatic handling of electrical components of the kind intended here.

I claim:

1. A device for handling an electrical component having terminal pins extending in the same direction by engagement with such pins, comprising in combination: a body part; cooperating elongate gripping elements supported by said body part for longitudinal movement relative thereto between a first position corresponding to an 'engage' condition of the component, and a second position corresponding to a 'release' condition thereof, said gripping elements having respective component-engaging ends thereto which are less widely spaced in the 'engage' condition of the component than in its 'release' condition; cooperating means for varying the spacing of the component-engaging ends of the gripping elements on movement of said elements between said first and second positions; and an actuator operatively connected with the gripping elements for effecting controlled longitudinal displacement thereof relative to the body part between said first and second positions, said actuator being connected with the gripping elements for movement relative thereto in the longitudinal direction thereof within predetermined limits.

2. A device as claimed in claim 1, wherein the gripping elements are spring biassed in the transverse direction.

3. A device as claimed in claim 2, wherein the gripping elements are springy.

4. The device as claimed in claim 1, and additionally including abutment means on the body part and wherein the elongate gripping elements are supported by said body part for longitudinal movement relative thereto within limits defined by said abutment means and said gripping elements.

5. The device as claimed in claim 4, wherein the limits defined by the said abutment means provide for a greater relative movement between the gripping elements and body part than between the elongate elements and the actuator.

6. The device as claimed in claim 1, wherein the body part is tubular and the elongate gripping elements are arranged in adjacent spaced generally parallel disposition within said body part to extend outwardly from a common end thereof in both the first and second positions, the actuator extending longitudinally of the body part and being disposed between said gripping elements for cooperative engagement therewith to enable displacement of the component from the gripping elements in said first position in an outward longitudinal direction before an operated return of said gripping elements to said second position.

7. The device as claimed in claim 6, wherein an elongate slot is provided in the actuator, and the gripping elements are connected together and to the actuator by pin means extending through said slot.

8. The device as claimed in claim 1, wherein the gripping elements are secured to the body part by attachment means engaged with the body part and gripping elements, said attachment means being adapted and arranged to allow a relative motion between the body part and gripping elements on adjustment between the said first and second positions.

9. The device as claimed in claim 8, wherein said gripping elements include aligned elongate slots and said attachment means comprises screw means extending transversely of the body part, and being in engagement with the aligned elongate slots in the gripping elements.

10. The device as claimed in claim 9, wherein the actuator includes an elongate slot therein in alignment with the slots in the gripping elements, and the screw means is common to both gripping elements and extends through the elongate slot in the actuator.

11. The device as claimed in claim 10, wherein the elongate slot in the actuator is of greater longitudinal extent than the corresponding slots in the gripping elements.

12. The device as claimed in claim 10, wherein the amount by which the length of the elongate slot in the actuator exceeds the length of the corresponding slots in the gripping elements is equal to the amount by which the actuator is movable relative to the gripping elements.

13. The device as claimed in claim 1, wherein said body part includes a cam means and said cooperating means comprises cam follower faces on the gripping elements engageable with said cam means on the body part.

14. The device as claimed in claim 13, wherein said cam follower faces comprise portions of the respective gripping elements which are inclined with respect to the direction of relative movement of the body part and gripping elements in moving between the first and second positions.

15. The device as claimed in claim 13, wherein said cam follower faces include a flat portion cooperable with said cam means to provide for a limited displacement of the gripping elements longitudinally of the body art while maintaining the gripping ends at a separation corresponding to the 'engage' condition of the device.

16. The device as claimed in claim 13, wherein said cam means comprises an edge of the body part with which the cam follower faces engage on relative movement of the body part and gripping elements between the first and second positions.

17. The device as claimed in claim 1, wherein the actuator extends throughout substantially the whole length of the gripping elements and is adapted and arranged to abut a component gripped by said gripping elements.

18. The device as claimed in claim 1, wherein the component engaging ends of said gripping elements are mutually inclined.

19. The device as claimed in claim 1, and additionally including slots in the body part at that end thereof from which the gripping elements protrude and screw means extending through the body part and adapted, upon progressive engagement to reduce the corresponding transverse dimension of the body part and the separation of the gripping ends in the open condition thereof.

20. A device for handling an electrical component having terminal pins extending in the same direction by engagement with such pins, comprising in combination: a body part; cooperating elongate gripping elements supported by said body part for longitudinal movement relative thereto between a first position corresponding to an 'engage2 condition of the component, and a second position corresponding to a 'release' condition thereof, said gripping elements having respective component-engaging ends thereto which are less widely spaced in the 'engage' condition of the component than in its 'release' condition; cooperating means for varying the spacing of the component-engaging ends of the gripping elements on movement of said elements between said first and second positions; and an actuator including a plunger operatively connected with the gripping elements for effecting controlled longitudinal displacement thereof relative to the body part between said first and second positions, said actuator being connected with the gripping elements for movement relative thereto in the longitudinal direction thereof within predetermined limits to enable displacement by means of said plunger of the component from the gripping elements in said first position in an outward longitudinal direction before an operated return of said gripping elements to said second position.

21. A device for handling an electrical component having terminal pins arranged in two substantially parallel rows, the device comprising
a tubular body part having two substantially parallel opposed inner guiding surfaces at one end;
two co-acting elongate strip-like gripping elements of a resilient material, the gripping elements having gripping ends for gripping co-action with the two rows of terminal pins from opposing sides of the electrical component and being connected to each other at their opposite ends and having portions diverging towards the gripping ends;

means for mounting the elongate gripping elements inside the tubular body part such that the gripping elements are in resilient engagement with the inner sides of the tubular body part and the gripping end portions of the gripping elements extend out of said one end of the tubular body part and such that the gripping elements and the tubular body part are displaceable relative each other in the general direction of the gripping elements and the tubular body part between a first relative position with expelled gripping elements and a second relative position with retracted gripping elements, and such that the diverging portions of the gripping elements and the inner guiding surfaces of the tubular body part co-act during at least a portion of a relative displacement between the gripping elements and the tubular body art to cause a controlled relative displacement of the gripping ends in a direction transverse to said general direction, the gripping end portions of the gripping elements in the first relative position being separated so that the gripping end portions can be applied over an electrical component to be gripped and the gripping end portions of the gripping elements in the second relative position being in gripping position with the gripping ends in a predetermined position for co-action with the two rows of terminal pins of the electric component; and plunger means coupled to the gripping elements and extending through the tubular body part from said one end thereof to the other end thereof, said plunger means having an abutting portion between the gripping end portions of the gripping elements at said one end for co-action with an electrical component and an actuating means at said other end for displacing the plunger means and the gripping elements relative to the tubular body part said plunger being connected with the gripping elements for movement relative thereto in the longitudinal direction thereof within predetermined limits.

* * * * *